US010747121B2

United States Patent
Moriya et al.

(10) Patent No.: US 10,747,121 B2
(45) Date of Patent: Aug. 18, 2020

(54) OPTICAL PROCESSING APPARATUS AND SUBSTRATE PROCESSING APPARATUS

(71) Applicant: Tokyo Electron Limited, Tokyo (JP)

(72) Inventors: Teruhiko Moriya, Koshi (JP); Masaru Tomono, Koshi (JP); Ryo Shimada, Koshi (JP); Makoto Hayakawa, Koshi (JP); Seiji Nagahara, Tokyo (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 15/828,906

(22) Filed: Dec. 1, 2017

(65) Prior Publication Data

US 2018/0164696 A1 Jun. 14, 2018

(30) Foreign Application Priority Data

Dec. 13, 2016 (JP) .................. 2016-240855
Aug. 18, 2017 (JP) .................. 2017-158220

(51) Int. Cl.
*G03F 7/20* (2006.01)
*H01L 21/677* (2006.01)
*H01L 21/67* (2006.01)

(52) U.S. Cl.
CPC ........ *G03F 7/70533* (2013.01); *G03F 7/7055* (2013.01); *G03F 7/70725* (2013.01); *G03F 7/70775* (2013.01); *G03F 7/70808* (2013.01); *H01L 21/6776* (2013.01); *H01L 21/67115* (2013.01)

(58) Field of Classification Search
CPC . G03F 7/70425; G03F 7/70391; G03F 7/7055
See application file for complete search history.

(56) References Cited

U.S. PATENT DOCUMENTS

| 5,929,976 A * | 7/1999 | Shibuya ................ G03F 7/2028 355/53 |
| 7,573,054 B2 * | 8/2009 | Iwashita ............... G03F 7/2022 250/559.36 |
| 2004/0227922 A1 * | 11/2004 | Dierichs ............. G03F 7/70075 355/71 |
| 2009/0002674 A1 * | 1/2009 | Kawanami ............. G03B 27/72 355/71 |
| 2016/0327869 A1 | 11/2016 | Nagahara et al. |

FOREIGN PATENT DOCUMENTS

JP  2015-156472 A1  8/2015

* cited by examiner

*Primary Examiner* — Steven Whitesell Gordon
(74) *Attorney, Agent, or Firm* — Burr & Brown, PLLC

(57) ABSTRACT

An optical processing apparatus includes: a housing; a stage; and a light irradiation unit configured to cause a light source unit to emit light so as to form a strip-like irradiation area extending over an area wider than a width of a substrate in a right and left direction. The stage and the light irradiation unit are moved by a moving mechanism relatively to each other in a back and forth direction. Light emitted from the light irradiation unit is deviated by a light-path changing unit from a relative movement area of a substrate. When a substrate is relatively moved below the light irradiation unit without the intension of being subjected to a light irradiation process, a control unit outputs a control signal such that an irradiation area is not formed on a surface of the substrate by the light-path changing unit, while the light source unit emitting light.

10 Claims, 13 Drawing Sheets

US 10,747,121 B2

OPTICAL PROCESSING APPARATUS AND SUBSTRATE PROCESSING APPARATUS

CROSS REFERENCE TO RELATED APPLICATIONS

This application is based upon and claims the benefit of priority from the prior Japanese Patent Application No. 2016-240855 filed on Dec. 13, 2016 and Japanese Patent Application No. 2017-158220 filed on Aug. 18, 2017, the entire contents of which are incorporated herein by reference.

FIELD OF THE INVENTION

The present invention relates to a technique for processing a substrate by emitting light onto a surface of the substrate.

BACKGROUND ART

As a method of forming a resist pattern on a semiconductor wafer or a glass substrate for a liquid crystal display panel, a method using a chemically amplified photosensitizing resist is known. When the resist is exposed by an exposure machine with the use of a pattern mask (pattern exposure), acid is generated in the exposed part. When the exposed part is further heated, the acid awakes to become soluble in alkali. By supplying the part soluble in alkali with a developer, a circuit pattern is formed.

Since a circuit pattern becomes finer and finer, a circuit pattern is required to have a high resolution. For example, an extreme ultraviolet (EVU) exposure is known as means for coping with this request. However, when a light intensity of an exposure light source for the EUV exposure is increased, an apparatus therefor becomes large, which results in increased cost. On the other hand, an apparatus of a small size is poor in light intensity, which reduces a throughput.

In addition, JP2015-156472A discloses an exposure apparatus using LEDs. In this exposure apparatus, a wafer coated with a chemically amplified photosensitizing resist is pattern-exposed with the use of a pattern mask, and then the pattern-exposed area is subjected to a flood exposure so as to improve an in-plane uniformity of a line width of the pattern on the wafer. The exposure apparatus is configured to move a wafer in a housing from one side to the other side thereof. The LEDs emit light to cover a wafer movement area in a width direction. While the LEDs emit light, a wafer is moved from one side to the other side to pass transversely across an irradiation area, so that the whole surface of the wafer is irradiated with light.

When a coating film is formed on a substrate, the substrate is pattern-exposed by using a pattern mask and then the substrate is subjected to a developing process, there is used a substrate processing system formed by connecting a coating and developing apparatus that performs formation of a coating film and a developing process, and an exposure apparatus that performs a pattern exposure process. In this case, the exposure apparatus that further exposes a pattern exposed area after a pattern exposure process is incorporated in the coating and developing apparatus. In this case, with a view to avoiding enlargement of the apparatus, a flood exposure apparatus is preferably provided with a common loading and unloading port through which a wafer is loaded and unloaded so as to avoid enlargement of a wafer transport area in a substrate processing apparatus.

In the case of such an exposure apparatus, in order that a wafer is loaded into the exposure apparatus, and that the wafer is unloaded therefrom after the whole surface of the wafer has been subjected to an exposure process, the wafer passes through a light irradiation area twice. Namely, upon loading, the wafer is moved from the loading and unloading port side to an inside, and upon unloading the wafer is moved from the inside to the loading and unloading port side. When a wafer passes through the light irradiation area plural times, it is difficult to adjust an amount of irradiation. Thus, it is necessary for a wafer to be moved below a light source without the intention of being exposed. However, if LEDs are turned off so as not to expose a wafer, it takes a long time for a light intensity of LEDs to become stable after the LEDs are again turned on. Thus, a throughput of the apparatus lowers.

SUMMARY OF THE INVENTION

The present invention has been made in view of the above circumstances. The object of the present invention is to provide a technique for processing the substrate by which a surface of a substrate is stably irradiated with light, while preventing lowering of throughput.

An optical processing apparatus according to one embodiment of the present invention comprises:

a housing having a loading and unloading port through which a substrate is loaded and unloaded;

a stage on which a substrate is placed, the stage being disposed in the housing;

a light irradiation unit disposed above stage, the light irradiation unit being configured to cause a light source unit to emit light so as to form a strip-like irradiation area extending over an area wider than a width of a substrate in a right and left direction;

a moving mechanism configured to move the stage and the light irradiation unit relatively to each other in a back and forth direction;

a light-path changing unit that deviates light emitted from the light irradiation unit from a relative movement area of a substrate; and a control unit configured to output a control signal such that an irradiation area is not formed on a surface of a substrate by the light-path changing unit while the light source unit is emitting light, when the substrate is relatively moved below the light irradiation unit without the intention of being subjected to a light irradiation process.

A substrate processing apparatus according to one embodiment of the present invention is configured to process a substrate having a resist film formed thereon, the substrate processing apparatus including the aforementioned optical processing apparatus.

In one embodiment of the present invention, the strip-like irradiation area extending over an area wider than the width of the substrate in the right and left direction is formed in the housing by the light irradiation unit, and the substrate is irradiated with light by relatively moving the stage on which the substrate is placed and the light irradiation unit in the back and forth direction. When the substrate is moved below the light irradiation unit without the intention of being subjected to a light irradiation process, light emitted from the light irradiation unit is deviated from the relative movement area of the substrate by the light-path changing unit. Thus, when a substrate is subjected to a light irradiation process, it is possible to avoid trouble caused by unstable light irradiation, which might be caused immediately after the light source unit is switched from off to on. In addition, it is prevented that a throughput is lowered by a time required for the light source unit to warm up.

DETAILED DESCRIPTION OF THE INVENTION

Figure 1:
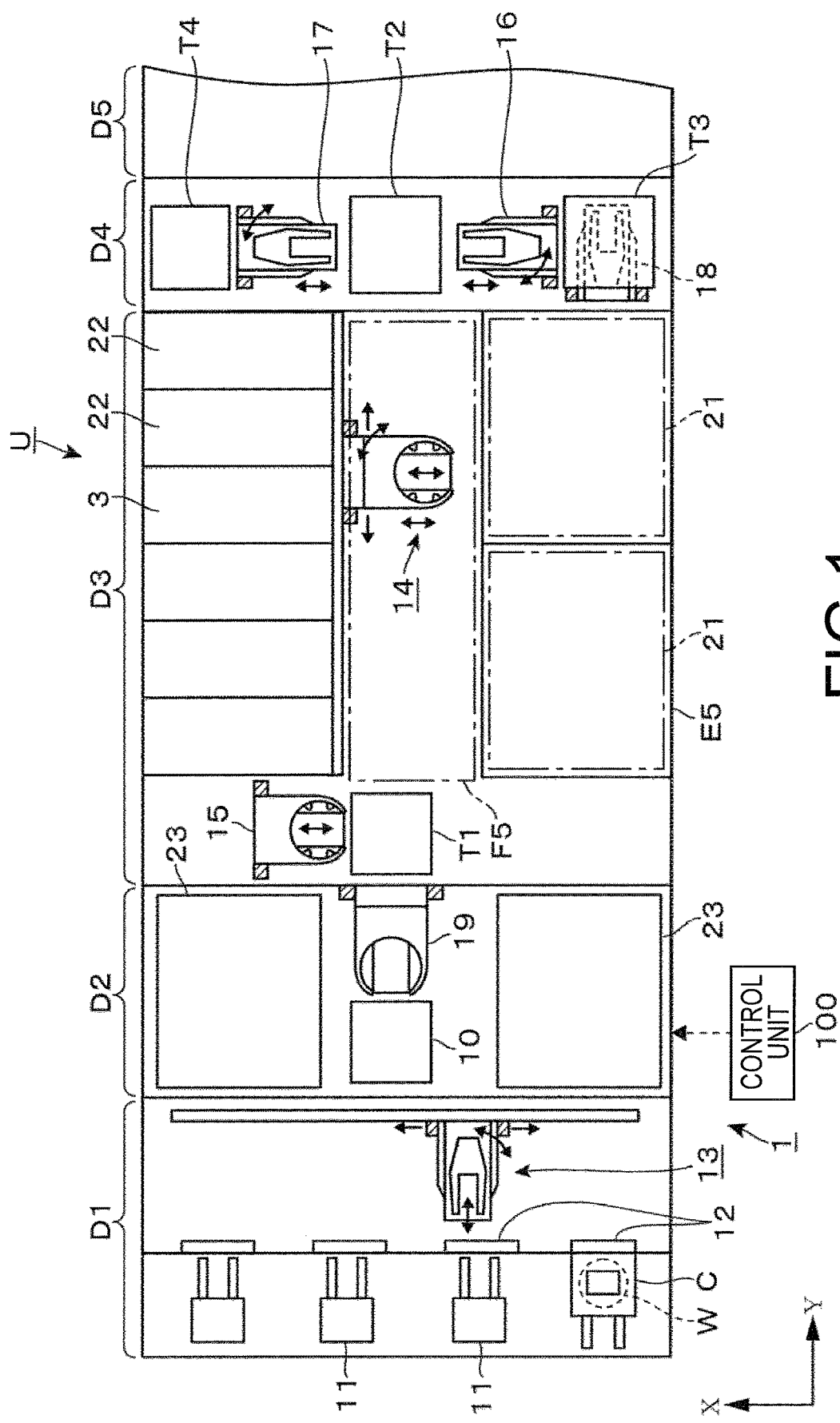
FIG. 1 is a plan view of a coating and developing apparatus according to an embodiment of the present invention.

A coating and developing apparatus is described as one example of a substrate processing apparatus according to an embodiment of the present invention. The coating and developing apparatus applies a chemically amplified photosensitizing resist to a wafer W, and develops the wafer W having been subjected to an exposure process so as to form a resist pattern thereon. As shown in FIG. 1, the coating and developing apparatus is formed by linearly connecting a carrier block D1, an inspection block D2, a processing block D3 and an interface block D4 in a transverse direction. In addition, an exposure apparatus D5 is connected to the interface block D4. The carrier block D1 has a stage 11 on which a carrier C is placed. The carrier C is configured to accommodate a wafer W which is a circular substrate. In the drawings, 12 depicts an opening and closing unit, and 13 depicts a transfer mechanism for transporting a wafer W between the carrier C and the inspection block D2.

The inspection block D2 is provided with two inspection apparatuses 23 which are arranged side by side in a right and left direction when seen from the side of the carrier block D1. In an area between the inspection apparatuses 23, a transfer stage 10 on which a wafer W is temporarily placed is disposed on the side of the carrier block D1, and a transfer mechanism 19 for transferring a wafer W among the transfer stage 10, the inspection apparatuses 23 and the processing block D3 is disposed on the side of the processing block D3. In the inspection apparatuses 23, a line width of a pattern which has been formed on a wafer W after a developing process is inspected. Specifically, a wafer W is diametrically divided into a plurality of areas and a pattern line width in each of the divided areas is detected. Pattern information in which a position of a divided area in the wafer W and a pattern line width are associated with each other is stored in a control unit 100.

Figure 2:
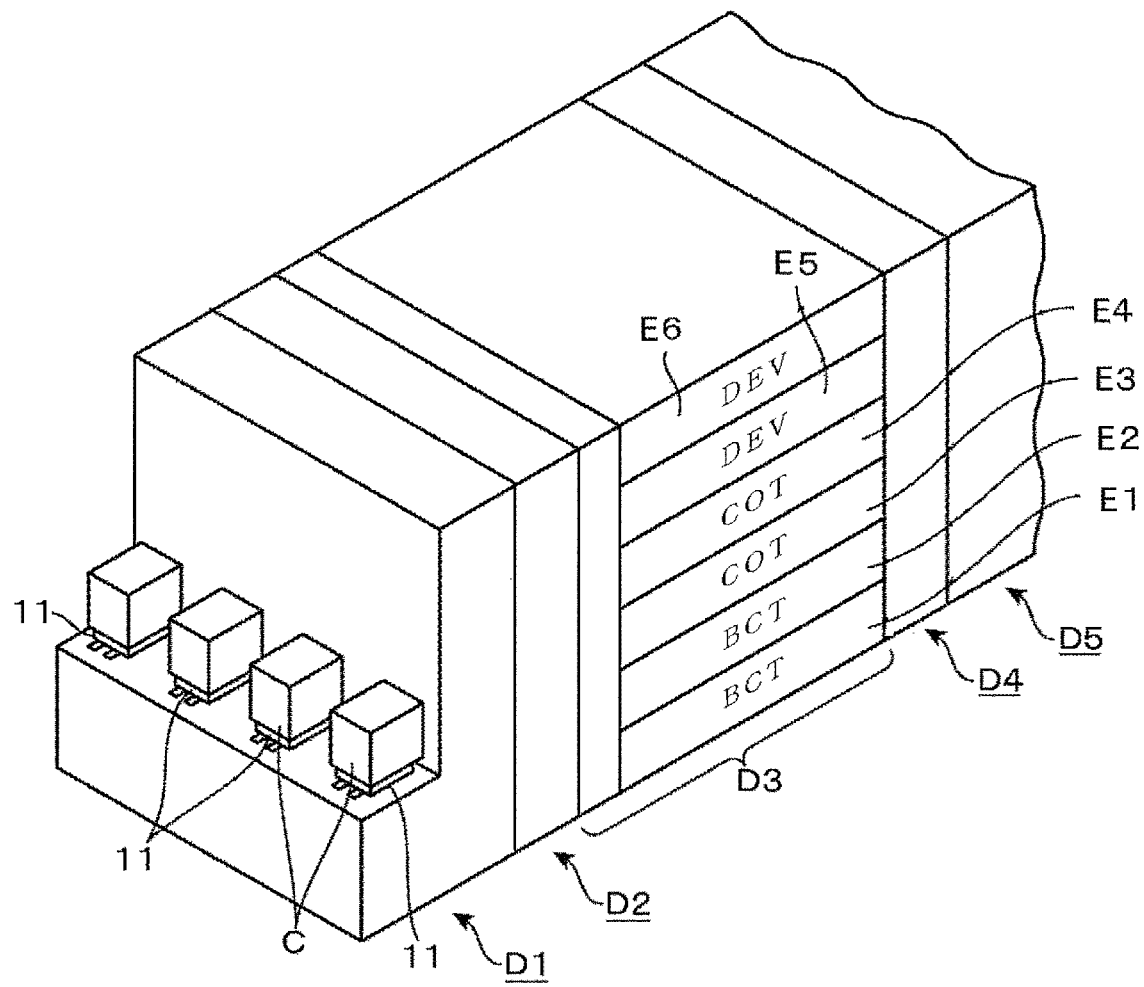
FIG. 2 is a perspective view of the coating and developing apparatus according to the embodiment of the present invention.

As shown in FIG. 2, the processing block D3 is formed by stacking unit blocks E1 to E6 each for liquid-processing a wafer W, in this order from below. In these processing block E1 to E6, wafers W are transported and processed in parallel. The unit blocks E1 and E2 have the same structure, the unit blocks E3 and E4 have the same structure, and the unit blocks E5 and E6 have the same structure.

The unit block E5 is described as a representative, with reference to FIG. 1. On one side in a right and left direction of a transport area F5 extending from the carrier block D1 toward the interface block D4, a plurality of shelf units U are arranged in a back and forth direction. The developing module 21 is configured to supply the developer to the resist film formed on the surface of the wafer W. On the other side, two developing modules 21 are arranged side by side in the back and forth direction. Each shelf unit U includes a heating module 22 that heats a wafer W, and a flood exposure apparatus 3 that is an optical processing apparatus. The aforementioned transport area F5 is provided with a transport arm 14 as a transport mechanism of a wafer W. In the respective modules provided on the unit block E5 and below-described towers T1 and T2, a wafer W is transported between the modules at the same level as that of the unit block E5.

The unit blocks E1 to E4 have the same structure as that of the unit blocks E5 and E6, excluding that different chemical liquids are supplied to a wafer W. The unit blocks E1 and E2 each include, instead of the developing module 21, an antireflection film forming module that supplies a wafer W with a chemical liquid for forming an antireflection film. The unit blocks E3 and E4 each include, instead of the developing module 21, a resist film forming module that forms a resist film by supplying a wafer W with a chemically amplified photosensitizing resist as a chemical liquid.

On the side of the inspection block D2 in the processing block D3, there are disposed the tower T1 vertically extending across the respective unit blocks E1 to E6, and a transfer arm 15 that is an elevatable transfer mechanism for transferring a wafer W to the tower T1. The tower T1 is formed by a plurality of modules stacked one on another, and has a transfer module on which a wafer W is placed.

The interface block D4 includes towers T2, T3 and T4 vertically extending across the respective unit blocks E1 to E6, and has an interface arm 16 that is an elevatable transfer mechanism for transferring a wafer W to the tower T2 and the tower T3, an interface arm 17 that is an elevatable transfer mechanism for transferring a wafer W to the tower T2 and the tower T4, and an interface arm 18 for transferring a wafer W between the tower T2 and the exposure apparatus D5. The exposure apparatus D5 exposes a surface of a wafer W by using a pattern mask. The tower 2 includes a transfer module, a buffer module that stores and keeps a plurality of wafers W that are not yet exposed, a buffer module that stores a plurality of wafers W that have been exposed, and a temperature adjustment module that adjusts a temperature of a wafer W, and so on, which modules are stacked one on another.

Figure 3:
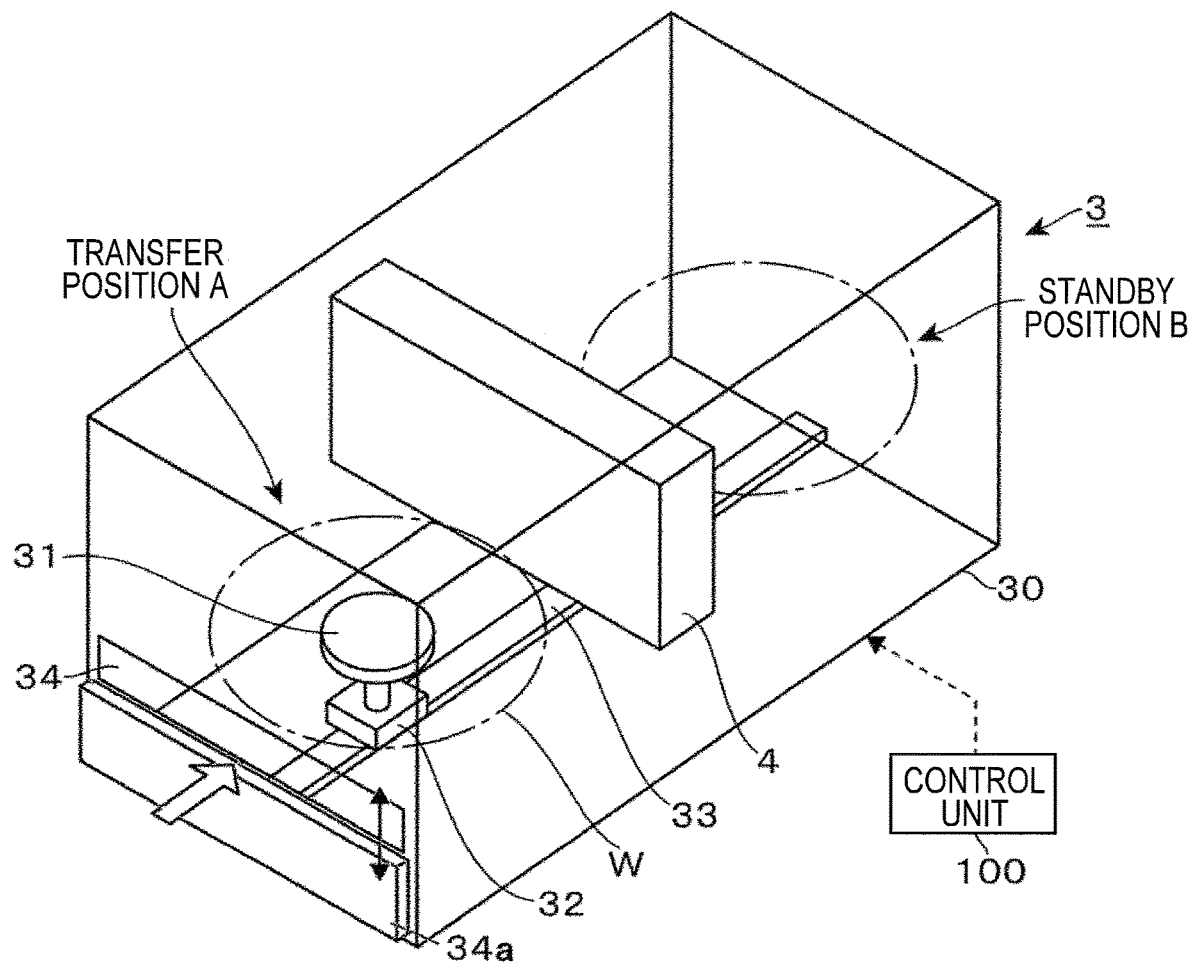
FIG. 3 is a perspective view showing a flood exposure apparatus.

Next, the flood exposure apparatus 3 is described. As shown in FIG. 3, the flood exposure apparatus 3 is disposed in a housing 30. The housing 30 is provided with a loading and unloading port 34 on the side of the transport area F5, for example. The loading and unloading port 34 is provided with an opening and closing plate 34a that opens and closes the loading and unloading port 34. The loading and unloading port 34 is configured to load and unload the wafer W. A stage 31 on which a wafer W is placed is disposed on a bottom surface of the housing 30. The stage 31 is moved along a guide rail 33 that extends in the housing 30 from a transfer position A for a wafer W, which is located on the side of the loading and unloading port 34, up to a standby position B in the back of the housing 30. At the standby position B, a wafer W that is not yet subjected to a flood exposure process stands by. The stage 31 is connected to a drive unit 32 for rotating a wafer W placed on the stage 31 about a vertical axis. The drive unit 32 corresponds to a moving mechanism and configured to move the stage 31 in a back and forth direction. The stage 31 is configured to be movable between the transfer position A at which a wafer F is transferred into the housing 30 through the loading and unloading port 34, and the standby position B at which a wafer F stands by. In the embodiment, the stage 31 is moved in the back and forth direction with respect to the light irradiation unit 4 (described later). However, the light irradiation unit 4 is moved in the back and forth direction with respect to the stage 31. Namely, the stage 31 and the light irradiation unit 4 is relatively moved each other in the back and forth direction.

Figure 4:
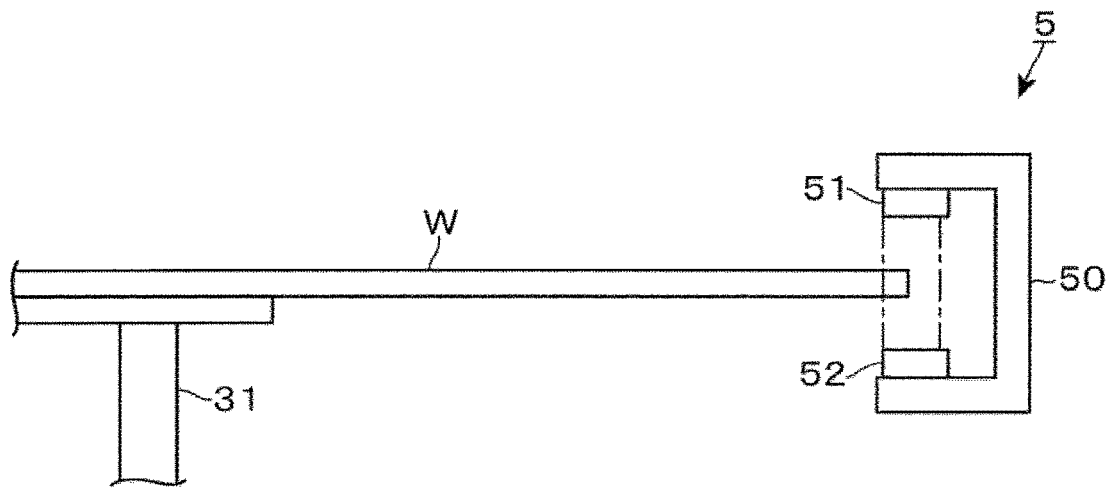
FIG. 4 is a side view showing an alignment mechanism.

The standby position B in the back of the housing 30 is equipped with an alignment mechanism 5 shown in FIG. 4. The alignment mechanism 5 includes an alignment light source 51 and a sensor 52. The alignment light source 51 and the sensor 52 are respectively fixed on a lower surface of a top plate of a frame unit 50 and an upper surface of a bottom plate thereof, so as to be opposed to each other.

When a wafer W placed on the stage 31 is moved to the standby position B, a peripheral portion of the wafer W is located such that it partially blocks a light path of light emitted from the alignment light source 51, and light that has passed by the wafer W without being blocked by the wafer W reaches the sensor 52. Based on the change in irradiation area in accordance with the rotation of the wafer W, which is detected by the sensor 52, an orientation of, e.g., notch formed in a periphery of the wafer W is detected, and an orientation of the wafer W to be exposed is controlled to be directed in a predetermined one.

Figure 5:
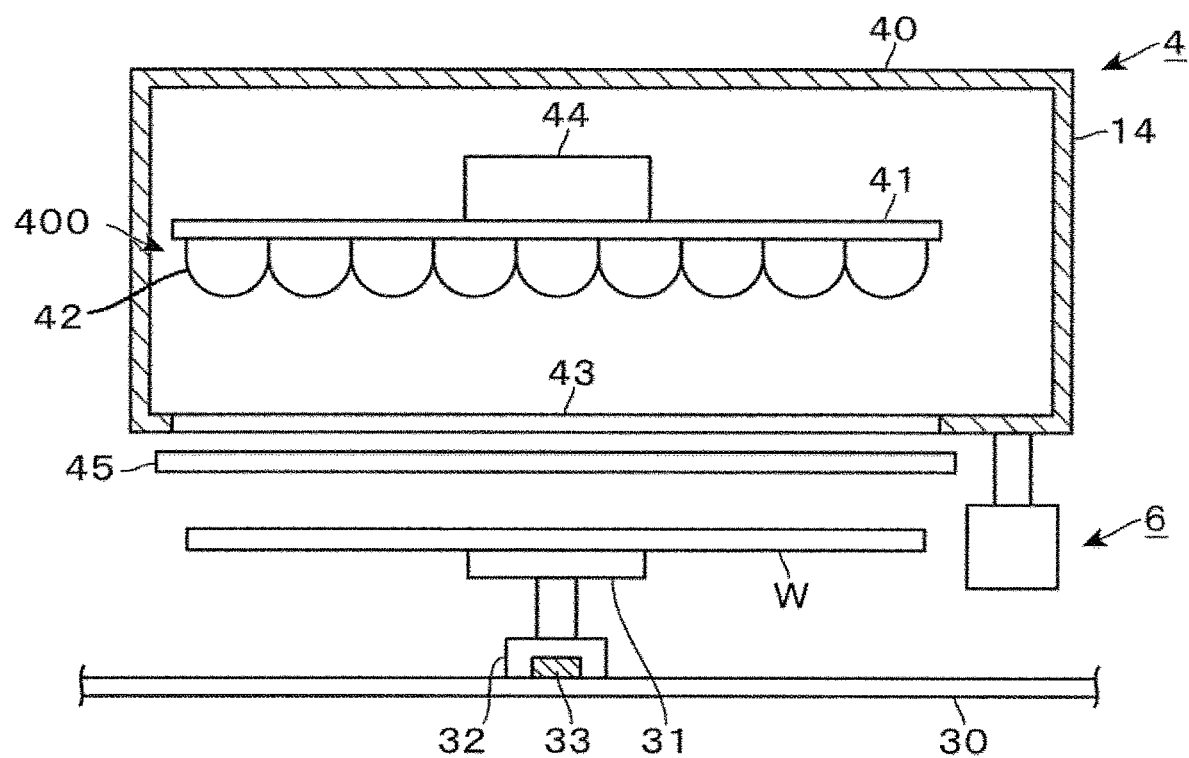
FIG. 5 is a vertically-sectioned front view showing a light irradiation unit.
Figure 6:
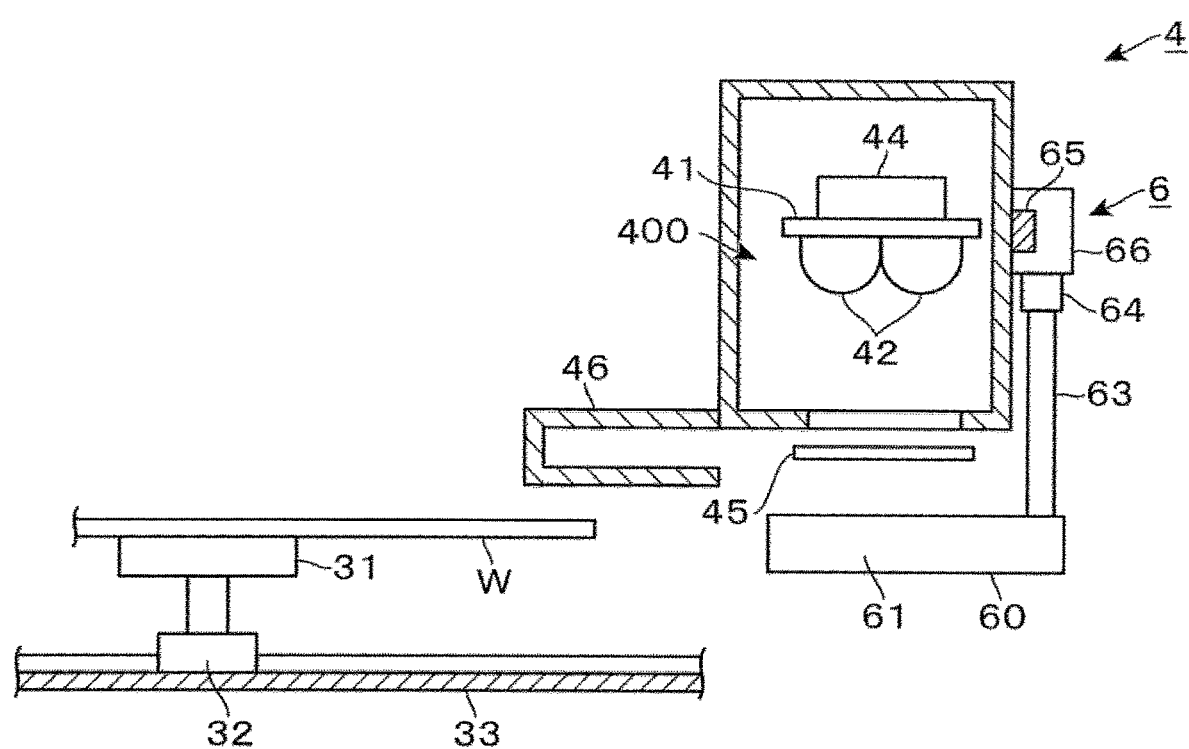
FIG. 6 is a vertically-sectioned side view showing the light irradiation unit.

In addition, a light irradiation unit 4 configured to emit ultraviolet light to a wafer W is disposed above an area where a wafer W is moved, between the transfer position A of a wafer W and the standby position B of a wafer W. The movement direction of a wafer W is referred to as back and forth direction. As shown in FIGS. 5 and 6, the light irradiation unit 4 has a rectangular case body 40 having a lateral width longer than a right and left width of the movement area of a wafer W. An LED (Light Emitting Diode) light source group 400 serving as a light source unit is provided inside the case body 40. The LED light source group 400 is formed by arranging in the right and left direction 88 cells side by side, each cell forming a row including a plurality of, e.g., "four" LEDs 42 that are arranged side by side in the back and forth direction. The drawings briefly show the arrangement of LEDs for the sake of difficulty in creating drawings and facility in understanding the structure.

The LED light source group 400 is fixed on a common LED board 41 disposed in the case body 40, and is located so as to emit ultraviolet light downward. A slit 43, which is an irradiation aperture extending in the right and left direction over the movement area of a wafer W, is formed in a bottom surface (bottom) of the base body 40. The ultraviolet light emitted from the LED light source group 400 travels toward a part below the light irradiation unit 4 through the slit 43. Thus, the light from the light irradiation unit 4 is emitted to an area, which is wider than the width of the movement area of a wafer W in the right and left direction, so that a strip-like irradiation area is formed. In addition, the light irradiation unit 4 has an LED control unit 44 disposed on an upper surface of the LED board 41. The LED control unit 44 is configured to control light intensities of LEDs 42 for each cell, based on a signal inputted from the control unit 100.

Figure 7:
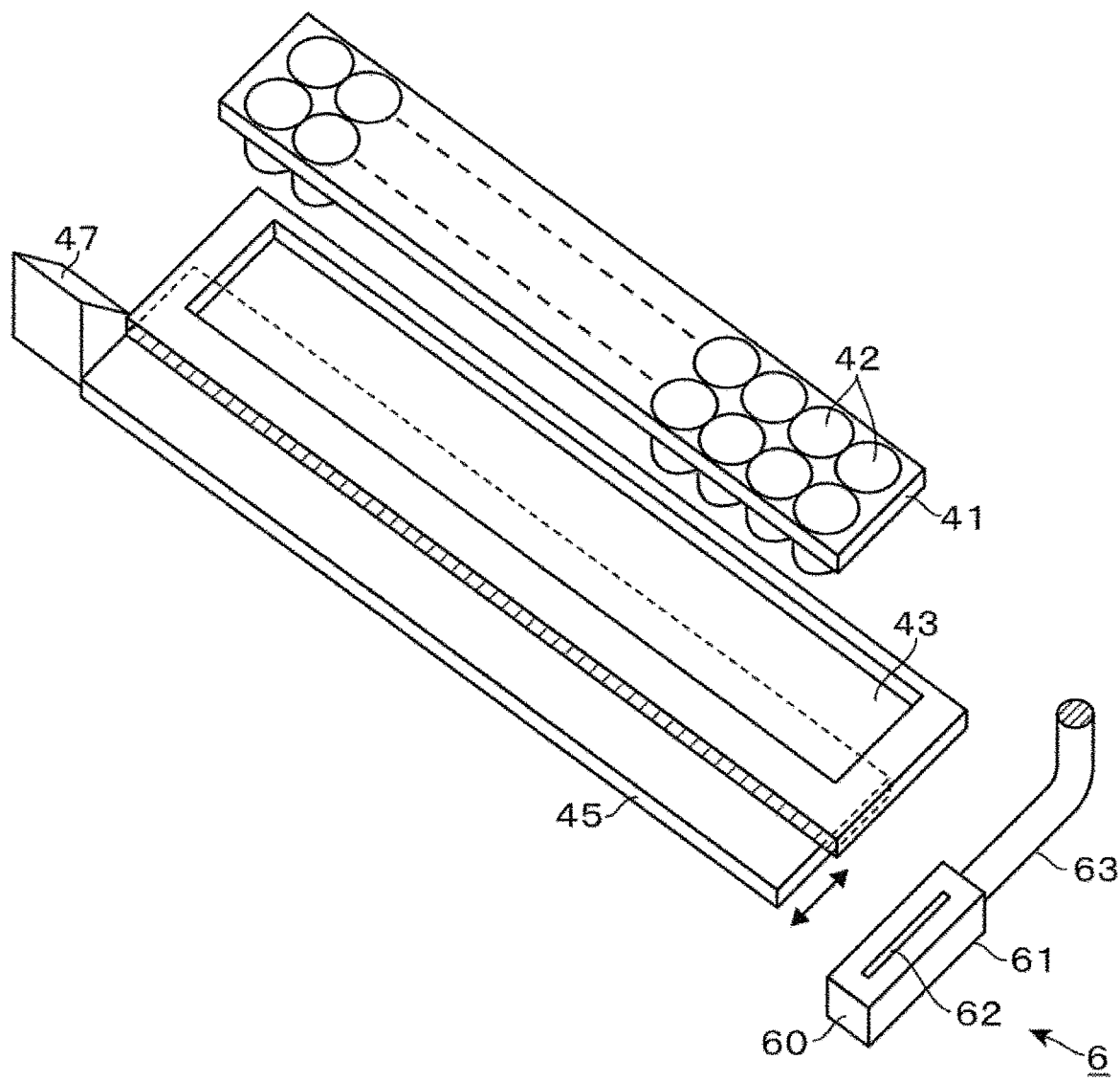
FIG. 7 is a perspective view of the light irradiation unit.

As shown in FIG. 6, on the front side (side of the transfer position A) at a lower end of the case body 40, there are disposed a metal shutter 45 that is a shielding member extending in the right and left direction of the movement area of a wafer W, and a shutter accommodation unit 46 for accommodating the shutter 45. Although the shutter 45 is formed by bending a front part of a flat plate to have an L-shaped cross-section, the shutter 45 is shown as a flat plate in the drawings in order for avoiding complexity. As shown in FIG. 7, a shutter drive unit 47 is disposed on one of right and left ends of the shutter 45. The shutter 45 is horizontally moved by the shutter drive unit 47 forward and rearward, between a position at which the shutter 45 is located below the case body 40 to close the slit 43, and a position at which the shutter 45 is accommodated in the shutter accommodation unit 46 to open the slit 43. The shutter 45 and the shutter drive unit 47 constitute a shielding mechanism which is one example of the light-path changing unit that deviates light emitted from the light irradiation unit 4 from a relative movement area of the wafer W. The shutter drive unit 47 is configured to be input a control signal which is output from the control unit 100. Namely, the control signal from the control unit 100 sends to the shutter drive unit 47 such that an irradiation area is not formed on a surface of the wafer W by the light-path changing unit while the LED light source group 400 is emitting light, when the substrate is relatively moved below the light irradiation unit without the intention of being subjected to a light irradiation process.

The shutter 45 has an irradiation surface which faces the slit 43 when the shutter 45 is closed, i.e., which is irradiated with light from the LEDs 42. This irradiation surface is provided with irregularities. Thus, when the shutter 45 receives light from the LEDs 42, the light is diffused. Thus, when the shutter 45 is closed, it is prevented that light emitted from the LEDs 42 is reflected toward the LEDs 42 at a high illuminance. In addition, a light absorption unit may be disposed in the light irradiation unit 4, so as to block light or prevent light whose light path is changed from being reflected to a part near the LEDs 42.

As shown in FIGS. 6 and 7, the flood exposure apparatus 3 is provided with an illuminance detection unit 6 for detecting, for each cell, illuminances of LEDs 42 in the light irradiation unit 4. A light collecting unit 60 is provided on a distal end of the illuminance detection unit 6. The light collecting unit 60 has a rectangular cylindrical housing 61 horizontally extending in the longitudinal direction of the cell. The housing 61 is provided with a slit 62 which extends over an irradiation area of a cell including LEDs 42 in the longitudinal direction of the light collecting unit 60. The light collecting unit 60 is connected to an illuminance sensor 64 through optical fibers 63. The illuminance sensor 64 is fixed on a moving mechanism 66 that moves along a guide rail 65 that is formed on a rear surface of the light irradiation unit 4 to extend in the right and left direction of the flood exposure apparatus 3. By moving the illuminance detection unit 6, the light collecting unit 60 located below a certain cell of LEDs 42 is horizontally moved in the right and left direction to a position below another cell of LEDs 42.

A light collector made of a rectangular parallelepiped fluorescent glass is disposed inside the housing 61 of the light collecting unit 60. The light collector emits light at an illuminance corresponding to an illuminance of light incident thereon through the slit 62. The light collector emits light in accordance with a total illuminance of light absorbed therein, i.e., a total illuminance of four LEDs 42 constituting the cell. By measuring an illuminance of the light collector by means of the illuminance sensor 64 through the optical fibers 63, the total illuminance of the four LEDs 42 constituting the cell is measured. The position of the illuminance detection unit 6, which is shown by the solid line in FIG. 5, is a position at which the illuminance detection unit 6 stands by during an exposure process of a wafer W. The light collecting unit 60 located at this position is out of the movement area of a wafer W. Namely, a wafer W and the light collecting unit 60 are positioned so as not to interfere with each other.

As shown in FIG. 1, the coating and developing apparatus 1 is equipped with the control unit 100 formed of a computer, for example. The control unit 100 includes a program storage unit. In the program storage unit, a program having commands enabling movement of the stage 31 in the flood exposure apparatus 3, light irradiation in the light irradiation unit 4, opening and closing of the shutter 45, and illuminance adjustment for each cell in the LED light source group 400, together with a process sequence of a wafer W in the coating and developing apparatus, is stored. The program is stored in a storage medium such as a flexible disc, a compact disc, a hard disc, an MO (magneto-optical disc) or memory card, and is installed in the control unit 100.

A process of a wafer W in a system composed of the aforementioned coating and developing apparatus and the exposure apparatus D5 is described. Firstly, a general flow of a wafer W in the coating and developing apparatus and the exposure apparatus D5 is described. A wafer W is transferred from the carrier C by the transfer mechanism 13 to be placed on the transfer stage 10 in the inspection block D2. Then, the wafer W is transported by the transfer mechanism 19 to the transfer module of the tower T1 in the processing block D3. The wafer W is transported to this transfer module is transported to a transfer module corresponding to the unit block E1 or E2 in the tower T1, which is allocated to that wafer W.

The wafer W is thus transported as described above is transported from the transfer module, to the antireflection film forming module, to the heating module, and to the transfer module, in this order. Then, the wafer W is transported by the transfer arm 15 to a transfer module corresponding to the unit block E3 or E4 allocated to that wafer W. The wafer W transported to the transfer module is transported to the corresponding resist-film forming module. Then, a chemically amplified photosensitizing resist is applied to the whole surface of the wafer W so that a resist film is formed thereon. Thereafter, the wafer W is transported to the heating module and to the transfer module of the tower T2 in this order, and is loaded into the exposure apparatus D5 through the tower T3. Then, an exposure process using a pattern mask is carried out. Thus, acid and photosensitizer are generated in an area of the wafer W, which was pattern-exposed by the exposure process.

The pattern-exposed wafer W is transported to the unit block E5 or E6. After that, the whole surface of the wafer W is exposed in the flood exposure apparatus 3. Thus, the aforementioned photosensitizer absorbs light so that acid and photosensitizer are further generated in the pattern-exposed area. Due to the flood exposure, the acid increases in the pattern-exposed area of the resist film. Thereafter, the wafer W is transported to the heating module 22 and is heated there. The pattern-exposed area heated by the heating module 22 is altered by the acid so as to become soluble in a developer. Following thereto, the wafer W is transported to the developing module 21, and is supplied with a developer. The altered area is dissolved in the developer, so that a resist pattern is formed. After that, the wafer W is transported to the tower T1, and is then loaded into the carrier block D1 through the inspection block D2. Finally, the wafer W is returned to the carrier C through the transfer mechanism 13.

Next, an operation of the flood exposure apparatus 3 is described. In the system composed of the aforementioned coating and developing apparatus and the exposure apparatus D5, before a wafer W as a product is processed, a film is formed on an inspection wafer. Based on pattern information of the inspection wafer obtained by the inspection apparatus 23, an illuminance of each cell in the LED light source group 400 in the flood exposure apparatus 3 is determined.

To be specific, before a process of a product wafer W is started in the coating and developing apparatus, a pattern is formed on an inspection wafer by using the same resist and the same pattern exposure mask as those to be used for a wafer W, for example. Then, the inspection wafer is subjected to the floor exposure in the flood exposure apparatus 3 in the same way as that for a product wafer, excluding that a reference light exposure is used, and is then developed. Thereafter, the developed inspection wafer is loaded into the inspection block D2 and is transported to the inspection apparatus 23.

The inspection apparatus 23 inspects a line width of the pattern formed on the inspection wafer. The inspection apparatus 23 divides the inspection wafer into areas in the width direction, e.g., into areas of which number is the same as the number of cells of the LEDs 42 in the flood exposure apparatus 3, and obtains pattern information in which a line width size of the pattern in each area and a position in a wafer W are associated with each other. The control unit 100 receives the pattern information, and creates data in which a position in the wafer W, e.g., a divided area position and a standardized light exposure value are associated with each other. Then, in order to make uniform accumulated amounts of light of the respective divided areas in the wafer W in the flood exposure apparatus 3, the control unit 100 sets, for each divided area position, a light intensity of a cell of LEDs 42 emitting light to the area.

Then, the illuminance sensor 64 measures illuminances of the respective cells of LEDs, and judges whether each cell of LEDs 42 has a set value or not. Then, the LED control unit 44 adjusts currents to be supplied to the LEDs 42 to adjust light intensities of the LEDs 42, whereby illuminances are set to have set values.

Figure 8:
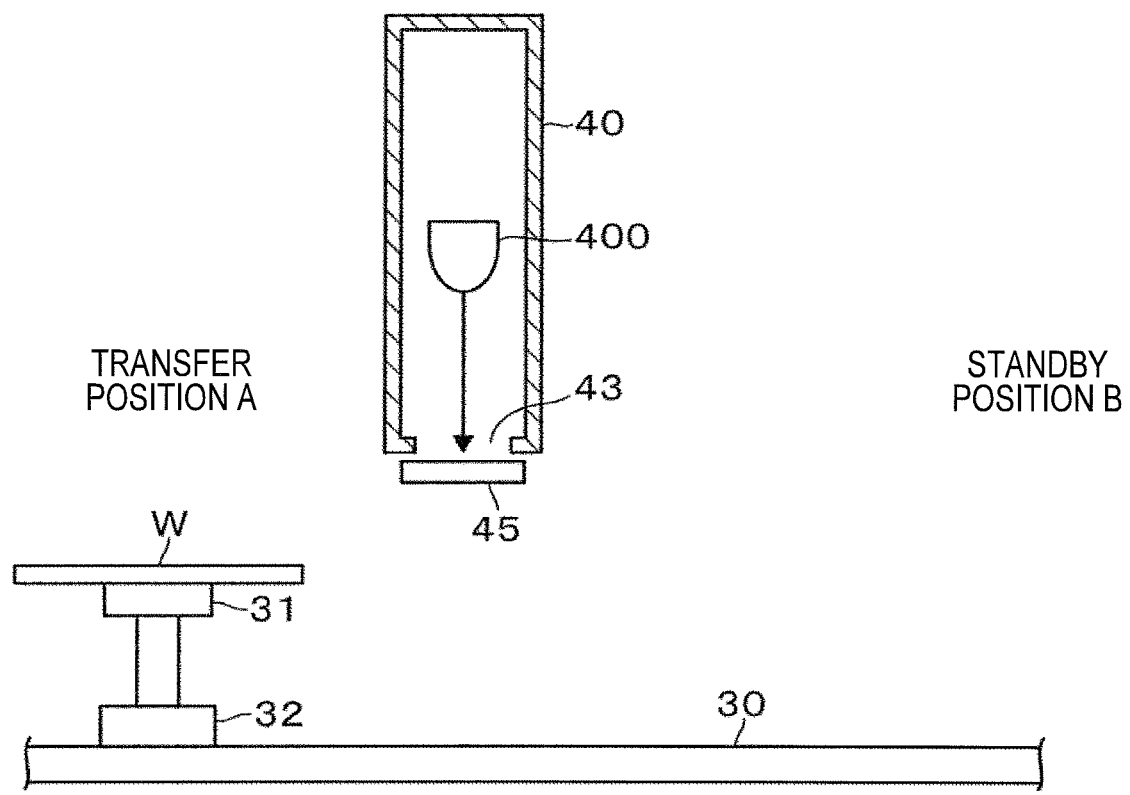
FIG. 8 is an explanatory view showing an operation of the embodiment of the present invention.
Figure 9:
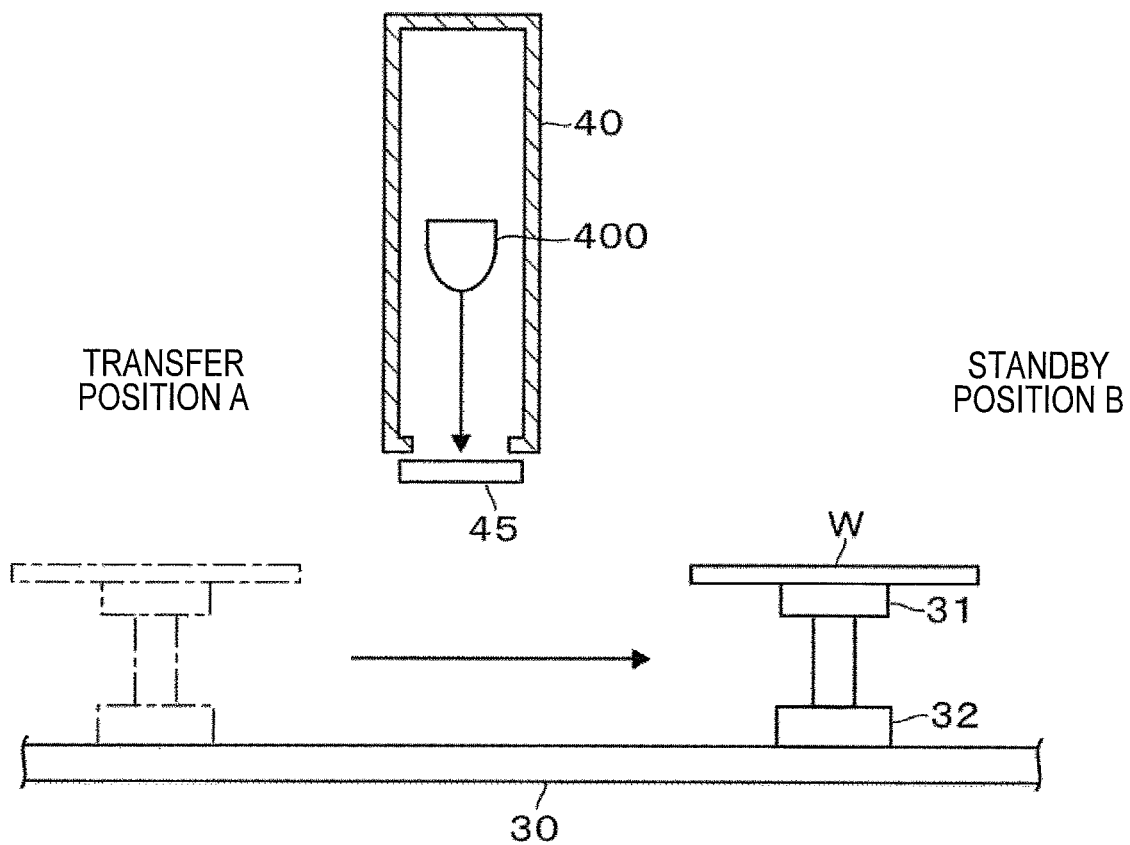
FIG. 9 is an explanatory view showing the operation of the embodiment of the present invention.

Thereafter, the opening and closing plate 34a is opened, and, as shown in FIG. 8, a product wafer W having been subjected to a pattern exposure, is firstly transferred by the transport arm 14 to the stage 31 located at the transfer position A. At this time, in the light irradiation unit 4, the LED light source group 400 is emitting light at a light intensity set for each cell (by supplying a set current) based on the pattern information obtained by the inspection apparatus 23, with the shutter 45 being closed. Then, the opening and closing plate 34a is closed, and, as shown in FIG. 9, the stage 31 is moved toward the standby position B, with the shutter 45 being closed. At this time, since the shutter 45 is closed, the movement area of the wafer W is not irradiated with light, whereby the wafer W can be moved to the standby position B without being exposed. Then, the wafer W is aligned at the standby position B as described above. Thus, the arrangement direction of the divided areas when the pattern information was obtained by the inspection apparatus 23, and the arrangement direction of the cells of LEDs 42 in the LED light source group 400 are aligned to each other.

Figure 10:
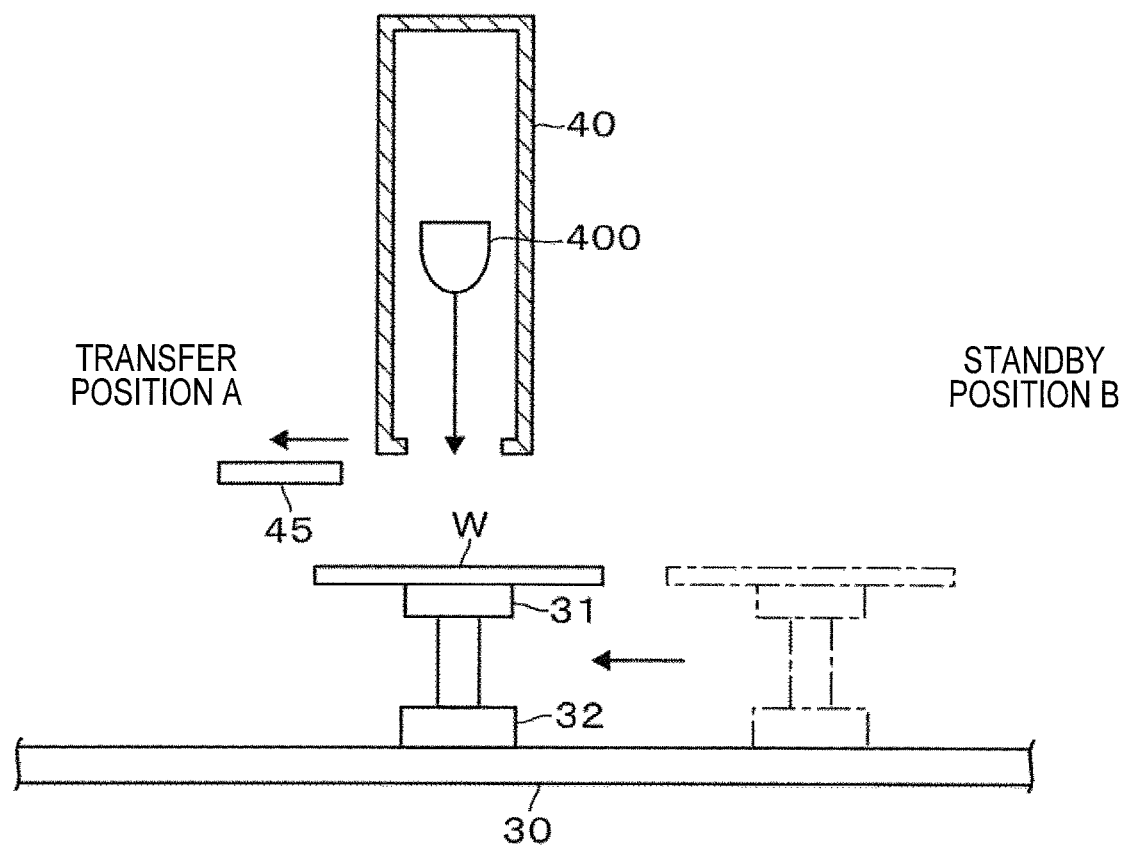
FIG. 10 is an explanatory view showing the operation of the embodiment of the present invention.

Following thereto, as shown in FIG. 10, the shutter 45 is opened. Thus, the movement area of the wafer W is irradiated with light. At this time, since light intensities of each cell of LEDs 42 in the LED light source group 400 are set for the respective cells, an irradiation area having a predetermined illuminance profile is formed in the width direction of the movement area of the wafer W.

When the respective cells of the LED light source group 400 expose respectively the corresponding divided areas in the wafer W, the respective cells are set such that accumulated light exposures are made uniform in the whole surface of the wafer W. Thus, by moving the wafer W from the standby position B to the transfer position A so as to be exposed, the light exposures on the whole surface of the wafer W, in addition to the light exposure of the pattern exposure by the exposure apparatus D5, are uniform. When the exposure process of the wafer W is ended, in the light irradiation unit 4, the shutter 45 is closed and accommodated in the shutter accommodation unit 46. Further, when the wafer W is returned to the transfer position A, the opening and closing plate 34a is opened, and the wafer W located at the transfer position A is taken out by the transport arm 14 and is transported to the developing apparatus. Since the whole surface of the wafer W has the uniform accumulated light exposure, line widths of the pattern on the whole surface of the wafer W become uniform upon the developing process. Then, the heating process is performed as described above, and the wafer W is returned to the carrier C. After that, a succeeding product wafer W, for example, is loaded into the flood exposure apparatus 3, the light irradiation process is similarly carried out.

In the above-described embodiment, when the wafer W loaded into the flood exposure apparatus 3 is moved from the side of the loading and unloading port 34 to the standby position B where the wafer W is aligned, the slit 43 serving as a light irradiation aperture is closed by the shutter 45. Then, when the wafer W is moved from the standby position B to the transfer position A, the shutter 45 is opened so that the wafer W is irradiated with light. Thus, when the wafer W is moved below the LED light source group 400 without the intention of exposing the wafer W, the wafer W is not exposed, and the LED light source group 400 continuously emits light without being turned off. Thus, since excessive deviation of light intensity, which might be caused when the LED light group 400 is switched from off to on, is prevented, the light intensity is stable. Thus, the wafer W is exposed promptly at a stable illuminance of light.

In addition, when the shutter 45 is not provided and the LED light source group 400 continuously emits light, a wafer W has to be unloaded from the standby position B shown in FIG. 2. On the other hand, in the above-described embodiment, a wafer W can be loaded to and unloaded from the same transfer position A. Thus, when the flood exposure apparatus 3 is installed in the coating and developing apparatus shown in FIG. 1, a module arrangement layout in the coating and developing apparatus is simple and enlargement of the apparatus can be avoided, because the number of loading and unloading port 34 of the flood exposure apparatus 3, which is disposed to face the transport area of a wafer W, is one.

When the LED light source group 400 is irradiated with intensive light, the LED light source group 400 may be adversely affected, e.g., the life duration of the LED light source group 400 may become short, and/or the LED light source group 400 may have an increased temperature so that an illuminance deviates from a set illuminance. Thus, an illuminance of light that is reflected by the shielding mechanism to reach the LED light source group 400 may be weakened. The illuminance that adversely affects the LED light source group 400 is an illuminance by which the life duration of the LED light source group 400 is reduced down to 90%, or an illuminance of the LED light source group 400 is deviated by ±5%.

As an example, the surface of the shutter 45 may be provided with irregularities. Due to the irregularities of the surface of the shutter 45, light emitted from the LED light source group 400 and then reflected by the shutter 45, is diffused, whereby an illuminance of the light reflected toward the LED light source group 400 can be attenuated and weakened. Thus, the illuminance of light reflected to the LED light source group 400 weakens. In addition, an antireflection film may be formed on the irradiation surface of the shutter 45, which is irradiated with light of the LED light source group 400. By providing a light attenuation unit such as an irregular surface and/or an antireflection film, which diffuses or attenuates a light intensity of the light to be reflected and returned to the LED light source group 400, on an irradiation surface of the shutter 45 which is irradiated with light from the LED light source group 400, it can be prevented that the LED light source group 400 is irradiated with light having a high illuminance.

In addition, the irradiation surface of the shutter 45, which is irradiated with light from the LED light source group 400, may be inclined at some degrees with respect to the arrangement direction of the cells in the LED light source group 400. Alternatively, the surface may be curved such that a light reflection direction is deviated from the direction toward the LED light source group 400. When light emitted to the shutter 45 is reflected in the direction toward the LED light source group 400, the LED light source group 400 is irradiated with light having a high illuminance (light having an intensive light intensity). However, since the light is reflected in a direction different from the direction toward the LED light source group 400, a light intensity of reflected light reflected toward the LED light source group 400 can be similarly suppressed. Thus, it can be similarly prevented that the LED light source group 400 is irradiated with intensive light.

In addition, the light irradiation unit 4 may be equipped with, e.g., a water cooling type cooling mechanism for cooling the shutter 45. Since the shutter 45 blocks light emitted from the LED light source group 400, the shutter 45 tends to accumulate heat. When the shutter 45 accumulates heat, an optical system may be warped so that an amount of light to be emitted varies. Thus, by cooling the shutter 45, the accuracy of an illuminance of light emitted to a wafer W can be improved.

Further, after a wafer W has been moved from the transfer position A to the standby position B below the LED light source group 400 without the intention of exposing the wafer W, the wafer W may be moved between the transfer position A and the standby position B plural times with the intention of exposing the wafer W. Furthermore, the position of the stage 31 may be fixed, and the light irradiation unit 4 may be moved in the back and forth direction while emitting light to a wafer W.

Moreover, in the embodiment of the present invention, a light irradiation apparatus may optically process a wafer W by irradiating the movement area of a wafer W with light, and by moving a wafer W through the light irradiation area while rotating the wafer W about a vertical axis. Further, when a wafer W is moved plural times between the transfer position A and the standby position B below the LED light source group 400 with the intention of exposing the wafer W, the wafer W may be moved with rotating the wafer W between the transfer position A and the standby position B to perform an optical process, and then the wafer W may be moved without rotating the wafer W between the transfer position A and the standby position B to perform the optical process.

In addition, not limited to a chemically amplified photo-sensitizing resist, the flood exposure apparatus 3 according to the embodiment of the present invention may be an apparatus that adjusts a sensitization and/or a line width of a wafer W coated with a general resist. In addition, the flood exposure apparatus 3 may be, e.g., an apparatus that improves an etching resistance by emitting light to expedite a crosslinking reaction of a carbon film in coating films, or an apparatus that promotes curing of a resist film. In addition, the flood exposure apparatus 3 may be an apparatus for curing an organic film, or an apparatus that adjusts a film thickness of a lower film in coating films by emitting light to a wafer W.

Figure 11:
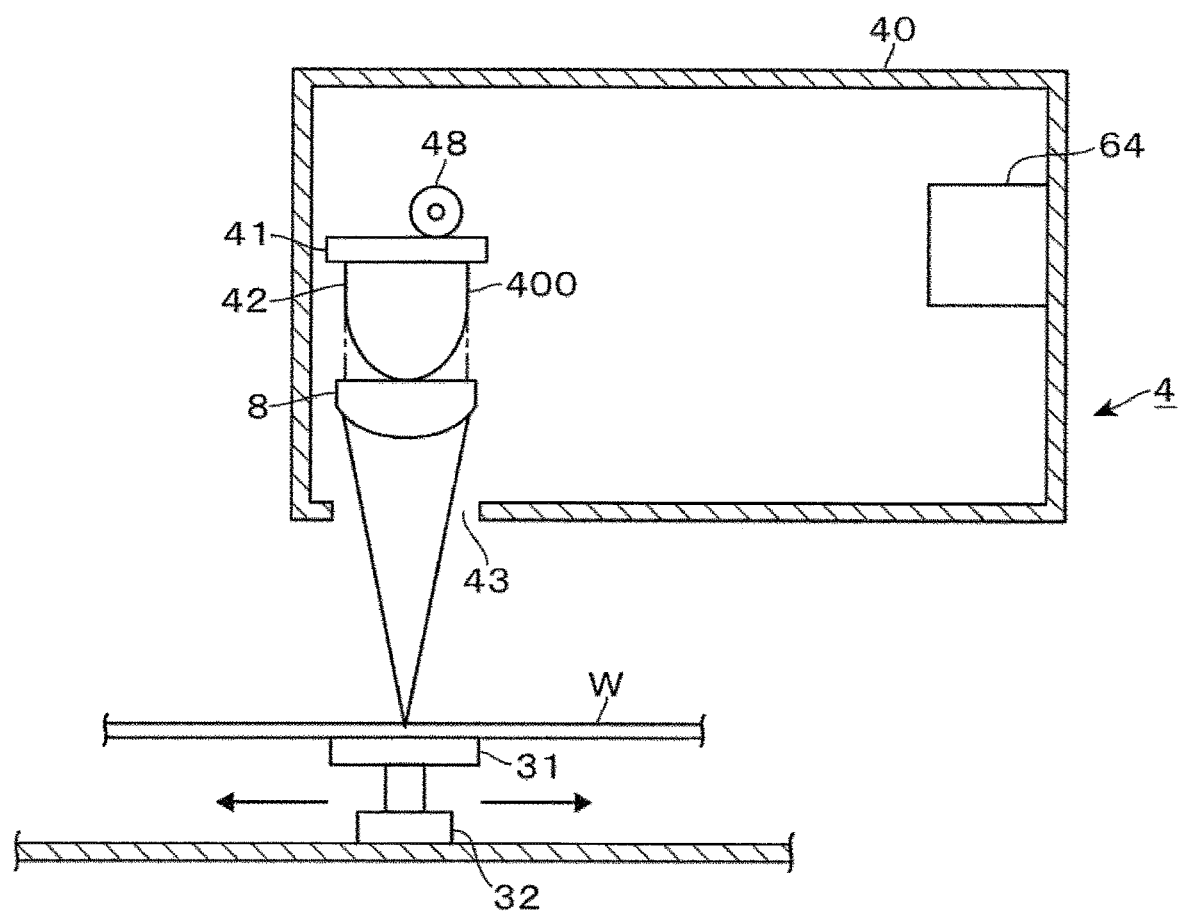
FIG. 11 is a sectional view showing another example of the flood exposure apparatus according to an embodiment of the present invention.

Next, another example of the flood exposure apparatus according to the embodiment of the present invention is described. The flood exposure apparatus may be structured such that a wafer W moving below the light irradiation unit 4 is not exposed, by changing an irradiation direction of the LED light source group 400, as shown in FIG. 11. In this example, the light-path changing unit is a rotation unit (rotation shaft 48) configured to rotate the LED light source group 400 about a horizontal axis. For example, the LED light source group 400 is configured to rotate about the rotation shaft 48 extending in the right and left direction. The reference number 8 in FIG. 11 is a convex lens for focusing, in each cell, light emitted from the LED light source group 400. Further, the illuminance sensor 64 is located at a position that is irradiated with light from the LED light source group 400 whose irradiation direction is directed in the horizontal direction in the case body 40. The illuminance sensor 64 is configured to be moved in the cell arrangement direction (right and left direction) in the LED light source group 400, so as to measure an illuminance of each cell of LEDs 42.

When a wafer W is exposed by emitting light below the light irradiation unit 4, as shown in FIG. 11, the irradiation direction of the LED light source group 400 is directed downward (a direction in which light passes through the slit 43). Thus, light from the LED light source group 400 is emitted through the slit 43 to the movement area of a wafer W below the light irradiation unit 4. By moving a wafer W, e.g., from the standby position B to the transfer position A with light being emitted below the light irradiation unit 4, the whole surface of the wafer W is irradiated with light and exposed.

Figure 12:
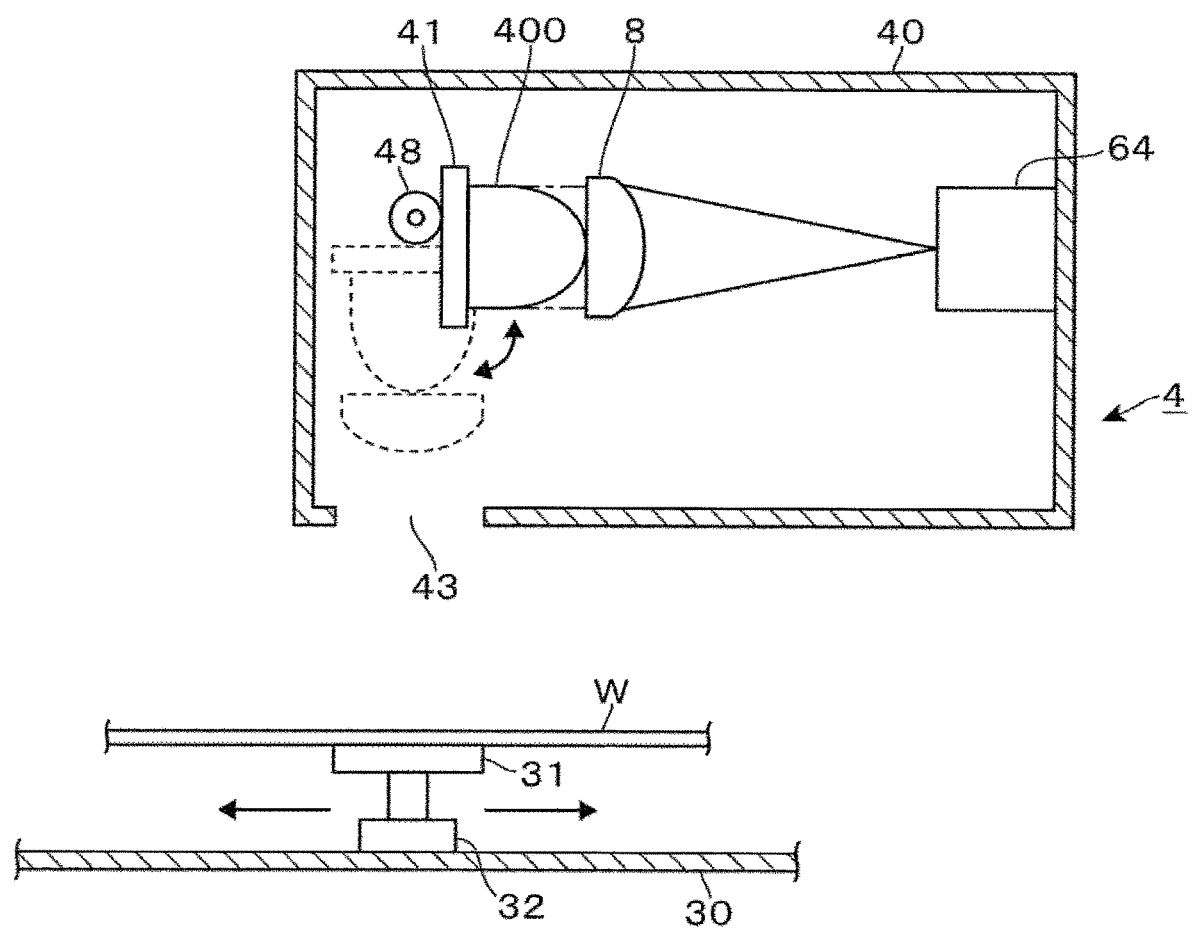
FIG. 12 is a sectional view showing an operation of another example of the flood exposure apparatus according to the embodiment of the present invention.

When a wafer W is moved below the light irradiation unit 4 without the intention of exposing the wafer W, for example, when a wafer W loaded into the flood exposure apparatus 3 is moved from the transfer position A to the standby position B, shown in FIG. 12, the LED light source group 400 is rotated about the rotation shaft 48 so that the irradiation direction of the LED light source group 400 is directed in the horizontal direction. Thus, a light path of light emitted from the LED light source group 400 is deviated from the slit 43. Thus, a wafer W can be moved below the light irradiation unit 4, without the surface of the wafer W being irradiated with light.

In addition, when there is a possibility that light diffused in the case body 40 leaks from the slit 43, the shutter 45 that opens and closes the slit 43, as shown in FIG. 7, may be provided. Thus, by deviating, from the slit, a light path of light emitted from the LED light source group 400, and also by closing the slit 43 with the shutter 45, a wafer W moving below the light irradiation unit 4 can be more reliably prevented from being irradiated with light.

Figure 13:
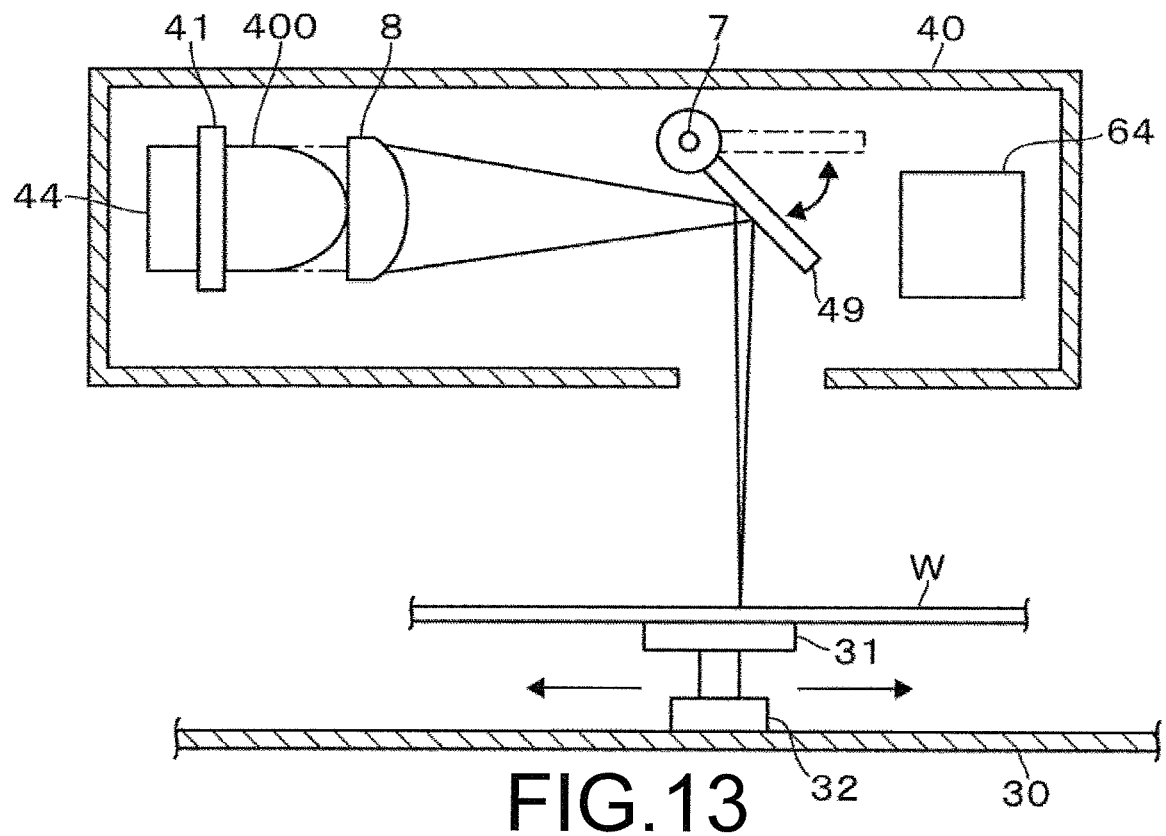
FIG. 13 is a sectional view showing another example of the flood exposure apparatus according to an embodiment of the present invention.

In addition, the light irradiation unit 4 may be configured such that a light path direction of the LED light source group 400 is switched by a mirror member 49 (another example of the light-path changing unit). For example, as shown in FIG. 13, the LED light source group 400 is disposed so as to horizontally emit light, and the mirror member 49 inclined at, e.g., 45° is disposed above the slit 43 in the light path of the LED light source group 400 so as to direct the light path downward. Thus, light reflected by the mirror member 49 passes through the slit 43 toward the movement area of a wafer W and is emitted to the wafer W. In addition, the mirror member 49 is configured to be rotated about a rotation shaft 7 extending in the right and left direction so as to adjust an installation angle of the mirror member 49.

Figure 14:
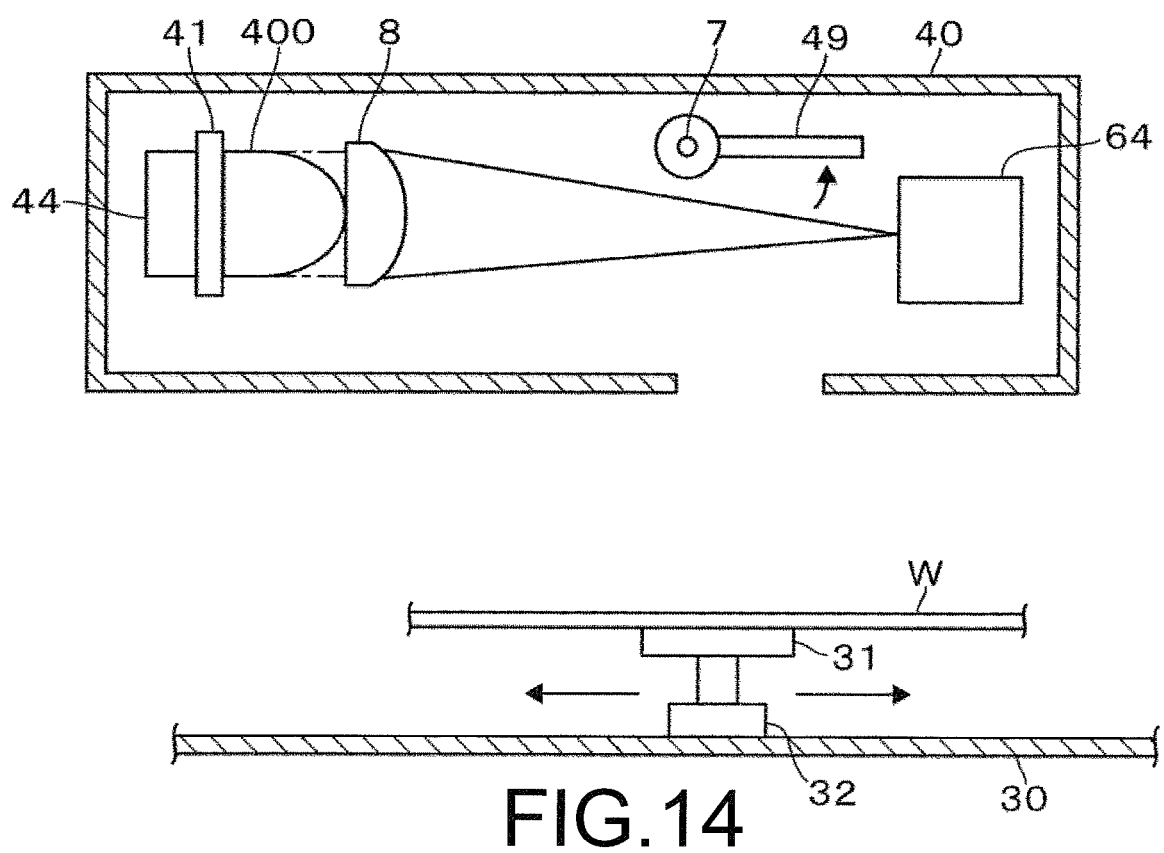
FIG. 14 is an explanatory view showing an operation of another example of the flood exposure apparatus according to an embodiment of the present invention.

When a wafer W is moved below the light irradiation unit 4 without the intention of exposing the wafer W, for example, when a wafer W is moved from the transfer position A to the standby position B, as shown in FIG. 14, the angle of the mirror member 49 is changed so that the mirror member 49 is deviated from the light path of light emitted from the LED light source group 400. Thus, light emitted from the LED light source group 400 horizontally travels so that the light path is deviated from the slit 43, whereby a wafer W moving below the light irradiation unit 4 can be prevented from being irradiated with light.

In addition, in the embodiment of the present invention, in a case where wafers W are successively processed by an optical processing apparatus, only when a wafer W is moved below the light irradiation unit 4 without the intention of exposing the wafer W, light emitted from the LED light source group 400 may be deviated from a relative movement area of substrates. Other than that, light emitted from the LED light source group 400 may be emitted to the relative movement area of the substrates.

Figure 15:
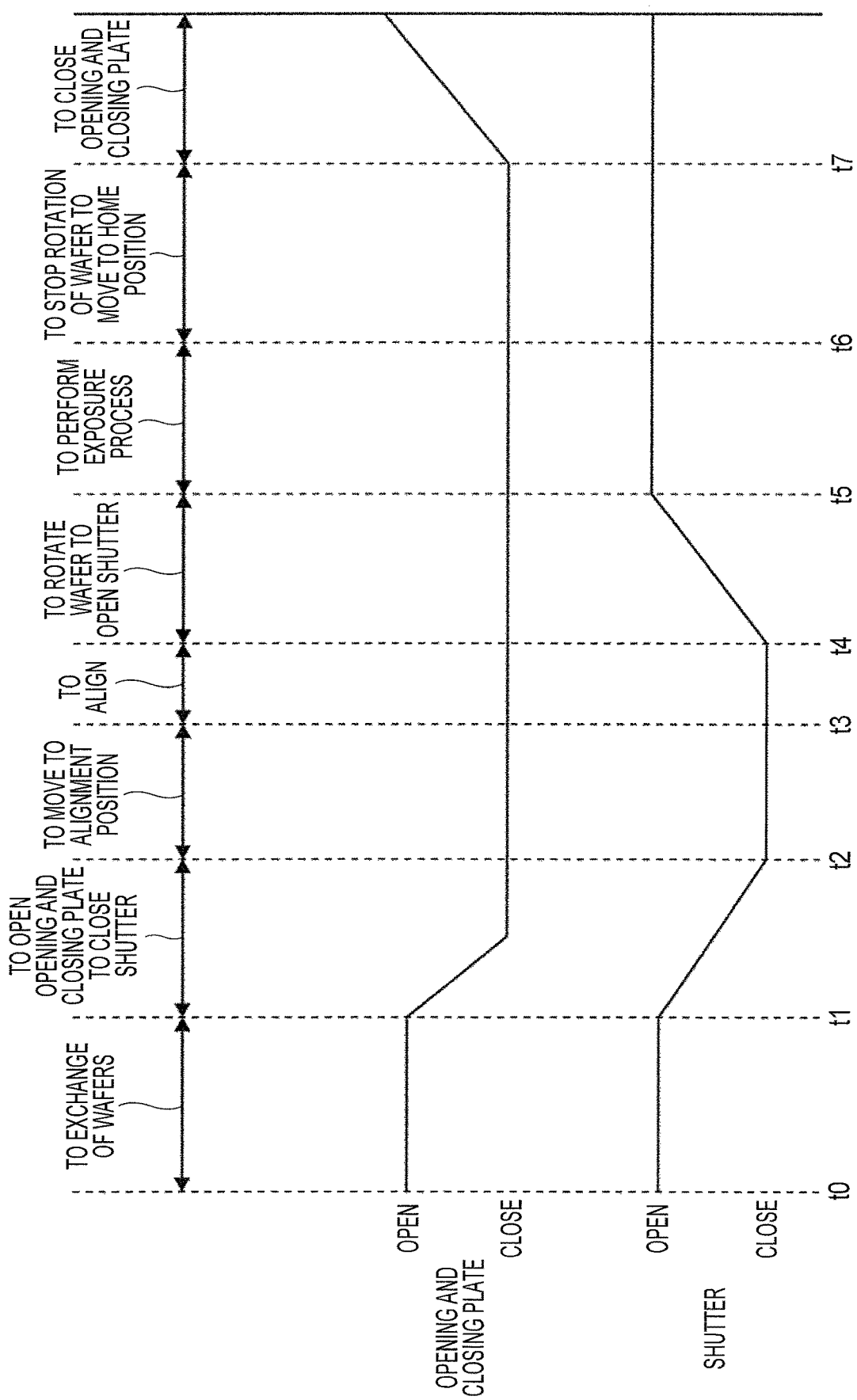
FIG. 15 is an explanatory view showing an example of a process sequence of the flood exposure apparatus.

Such an example is described with reference to FIG. 15 about a process sequence using the flood exposure apparatus 3 shown in FIGS. 3 to 7. In this example, the opening and closing plate 34*a* is opened at a timing t0, and a wafer W, which has been already subjected to a light irradiation process in the flood exposure apparatus 3 and returned to the transfer position A, is unloaded by the transport arm 14. Then, a wafer W to be succeedingly processed is transferred to the stage 31 located at the transfer position A (exchange of the processed wafer W and the unprocessed wafer W). Further, the transport arm 14 is retracted outside the flood exposure apparatus 3. At a timing t1, the opening and closing plate 34*a* is closed, and the shutter 45 is closed. Then, the stage 31 is moved toward the standby position (alignment position) B (between timings t2 and t3) with the shutter 45 being closed. At the standby position B, the wafer W is aligned. At a timing t4 after completion of the alignment of the wafer W, the shutter 45 is opened and the rotation of the wafer W is started.

With the movement area of the wafer W being irradiated with light, the wafer W is moved below the light irradiation unit 4 while maintaining the rotation speed of the wafer W. In more detail, the stage 31 is accelerated at the alignment position up to a predetermined rotation speed, and then the stage 31 is moved forward, e.g., for one second, to reach an exposure area of a wafer W. Then, the exposure is started. Thus, a timing t5 in FIG. 15 includes a time point one second after a time point at which the wafer W reaches the predetermined rotation.

Thus, the whole surface of the wafer W is irradiated with light and exposed (timing t6). After the wafer W has passed through the exposure area, the rotation of the wafer W is decelerated to stop the rotation, with the shutter 45 being opened. Then, the wafer W is moved to the transfer position A (timing t7). Further, the opening and closing plate 34a is opened with the shutter 45 being opened, and the wafer W having been subjected to the light irradiation process is unladed. Following thereto, a succeeding product wafer W is transferred to the stage 31, and the light irradiation process is similarly performed to the wafer W.

In this embodiment, only when the wafer W is moved from the transfer position A to the standby position B for the alignment thereof, the shutter 45 is closed. Namely, only when the wafer W is moved below the light irradiation unit 4 without the intention of performing a light irradiation process, the shutter 45 is closed. Thus, a total time in which light is emitted from the LED light source group 400 and the shutter 45 of the light irradiation unit 4 is closed can be reduced. In the above-described embodiment, during the operation of the apparatus, the LED light source group 400 is in the ON state. Thus, when the time in which the shutter 45 is closed is long, the time in which the shutter 45 is irradiated with light from the LEDs 42 gets long. In this case, the shutter 45 may be warped by heat, although it depends on a material thereof. In addition, since the time in which light from the LEDs 42 is reflected by the shutter 45 gets long, the time in which the LEDs 42 are subjected to the reflection light also gets long. Therefore, the life duration of the LED light source group 400 tends to be short.

As a result, by closing the shutter 45 only when a wafer W is moved below the light irradiation unit 4 without the intention of exposing the wafer W, and by opening the shutter 45 other than that, a degree of freedom of a material of the shutter 45 can be increased, as well as trouble such as deterioration of the LED light source group 400 can be suppressed.

What is claimed is:

1. An optical processing apparatus comprising:
   a housing having a loading and unloading port through which a substrate is loaded and unloaded;
   a stage on which a substrate is placed, the stage being disposed in the housing and being movable on a guide rail defining a substantially linear path alternating between a transfer position proximate the loading and unloading port and a standby position spaced away from the transfer position;
   a light irradiation unit disposed above the stage, the light irradiation unit including a light source having a plurality of light units emitting light through an elongated slit extending in a first direction transverse to the substantially linear path and irradiating a portion of the substrate extending in the first direction over a distance greater than a width of the substrate in the first direction;
   a moving mechanism configured to move the stage and the substrate alternating between the transfer position and the standby position;
   a light-path changing unit that deviates light emitted from the light irradiation unit from a relative movement area of the substrate, the light path changing unit including a shutter movable in a second direction transverse to the first direction between a first position at least partially within a shutter accommodation unit with the slit uncovered and the light being emitted therethrough, and a second position substantially covering the slit and preventing the light from being emitted therethrough, the shutter facing the relative movement area; and
   a control unit controlling the moving mechanism, the light source unit, and the light path changing unit,
   wherein:
   the shutter has a distance greater than the width of the substrate in the first direction,
   the control unit controls the light path changing unit to move the shutter to the first position, whereby light is emitted through the slit to the substrate, while controlling the moving mechanism to move the stage with the substrate placed thereon from the standby position to the transfer position, controls the light source unit to change a light intensity of each of the plurality of light units, and controls the light path changing unit to move the shutter to the second position preventing the light from being emitted through the slit to the substrate while controlling the moving mechanism to move the stage with the substrate placed thereon from the transfer position to the standby position.

2. The optical processing apparatus according to claim 1, wherein when the light irradiation aperture is shielded by the shielding mechanism, an illuminance of reflected light that is reflected thereon to reach the light source unit is an illuminance that does not adversely affect the light irradiation unit.

3. The optical processing apparatus according to claim 1, wherein the shutter has an irradiation surface to be irradiated with the light of the light irradiation unit, the irradiation surface being provided with irregularities.

4. The optical processing apparatus according to claim 1, wherein the shutter has an irradiation surface to be irradiated with the light of the light irradiation unit, the irradiation surface being provided with an antireflection film.

5. The optical processing apparatus according to claim 1, wherein the shielding mechanism has an irradiation surface to be irradiated with light of the light source unit, the irradiation surface being inclined such that reflected light is reflected at an angle different from a direction toward the light irradiation unit.

6. The optical processing apparatus according to claim 1, wherein
   the light-path changing unit is a rotation unit configured to rotate the light irradiation unit about a horizontal axis.

7. The optical processing apparatus according to claim 1, wherein the light-path changing unit is a mirror member capable of switching a light path of light emitted from the light irradiation unit, between a direction in which the light path passes through the slit, and a direction in which the light path is deviated from the slit.

8. The optical processing apparatus according to claim 1, wherein the apparatus pattern-exposes the substrate having a resist film formed thereon with the use of a pattern mask, and then exposes an area of the substrate pattern-exposed.

9. The optical processing apparatus according to claim 1, wherein at least one light source unit of the plurality of light source units is an LED.

10. A substrate processing apparatus configured to process a substrate having a resist film formed thereof, the substrate processing apparatus including the optical processing apparatus according to claim 1.

* * * * *